(12) United States Patent
Zhang et al.

(10) Patent No.: US 7,965,513 B2
(45) Date of Patent: Jun. 21, 2011

(54) ELECTRONIC DEVICE ASSEMBLY WITH HEAT DISSIPATION DEVICE

(75) Inventors: Jian Zhang, Shenzhen (CN); Jian-Ping Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/695,161

(22) Filed: Jan. 28, 2010

(65) Prior Publication Data

US 2011/0110042 A1 May 12, 2011

(30) Foreign Application Priority Data

Nov. 12, 2009 (CN) .......................... 2009 1 0309644

(51) Int. Cl.
*H05K 7/20* (2006.01)

(52) U.S. Cl. .............. 361/700; 361/679.47; 361/679.52; 361/701; 361/702; 165/80.5; 165/104.21; 165/104.26; 165/104.33

(58) Field of Classification Search ............. 361/679.46, 361/679.47, 679.52, 679.53, 679.54, 700–704, 361/709–712, 715, 719; 165/80.2, 80.3, 165/80.4, 80.5, 86, 104.21, 104.26, 104.33, 165/104, 34, 185; 257/706–727; 174/16.3, 252

See application file for complete search history.

(56) References Cited

U.S. PATENT DOCUMENTS

| 4,345,642 | A | * | 8/1982 | Ernst et al. ...................... 165/86 |
| 5,960,865 | A | * | 10/1999 | Costa et al. ...................... 165/86 |
| 6,125,035 | A | * | 9/2000 | Hood et al. .............. 361/679.47 |
| 6,137,683 | A | * | 10/2000 | Lee et al. ...................... 361/704 |
| 6,359,780 | B1 | * | 3/2002 | McMahan et al. ........ 361/679.47 |
| 6,377,454 | B1 | * | 4/2002 | Inoue et al. .............. 361/679.52 |
| 7,327,576 | B2 | * | 2/2008 | Lee et al. ...................... 361/719 |
| 7,755,900 | B2 | * | 7/2010 | Cheng ........................... 361/710 |

\* cited by examiner

*Primary Examiner* — Michael V Datskovskiy

(74) *Attorney, Agent, or Firm* — Frank R. Niranjan

(57) ABSTRACT

An exemplary electronic device assembly includes a printed circuit board with an electronic component thereon, and a heat dissipation device. The heat dissipation device includes a heat sink mounted on the printed circuit board and a heat pipe pivotably engaged with the heat sink. The heat sink includes a main body defining a transverse channel therethrough and an injection aperture at a top of the main body to communicate the channel and an exterior of the main body. The heat pipe is pivotably engaging in the channel of the main body. A gap is defined between the heat pipe and the heat sink. Heat conductive grease is injected into the channel and filled in the gap between the heat pipe and the heat sink to thermally connect the heat sink with the heat pipe.

16 Claims, 6 Drawing Sheets

ELECTRONIC DEVICE ASSEMBLY WITH HEAT DISSIPATION DEVICE

BACKGROUND

1. Technical Field

The present disclosure generally relates to electronic devices and, more particularly, to an electronic device having a heat dissipation device for cooling an electronic component of the electronic device.

2. Description of Related Art

To keep electronic components operating normally, heat generated by the electronic components must be timely removed. Typically, a heat sink is attached to an outer surface of an electronic component to absorb heat from the electronic component, and the heat absorbed by the heat sink is then dissipated into the ambient air.

Conventionally, the heat sink includes a plurality of fins. In order to enhance the heat dissipating effect of the heat sink, a heat pipe is engaged with the fins. For example, the fins are soldered to the heat pipe. Solder is heated to combine the fins and the heat pipe. However, a lot of gaps may exist between the fins and the heat pipe after the soldering process; and thereby the heat resistance at the interface between the fins and the heat pipe is increased. In addition, the soldering process is somewhat complex and adds to manufacturing costs.

Thus, it is desirable to devise a heat dissipation device which has good heat conductance and overcomes the above-described shortcomings.

DETAILED DESCRIPTION

Figure 1:
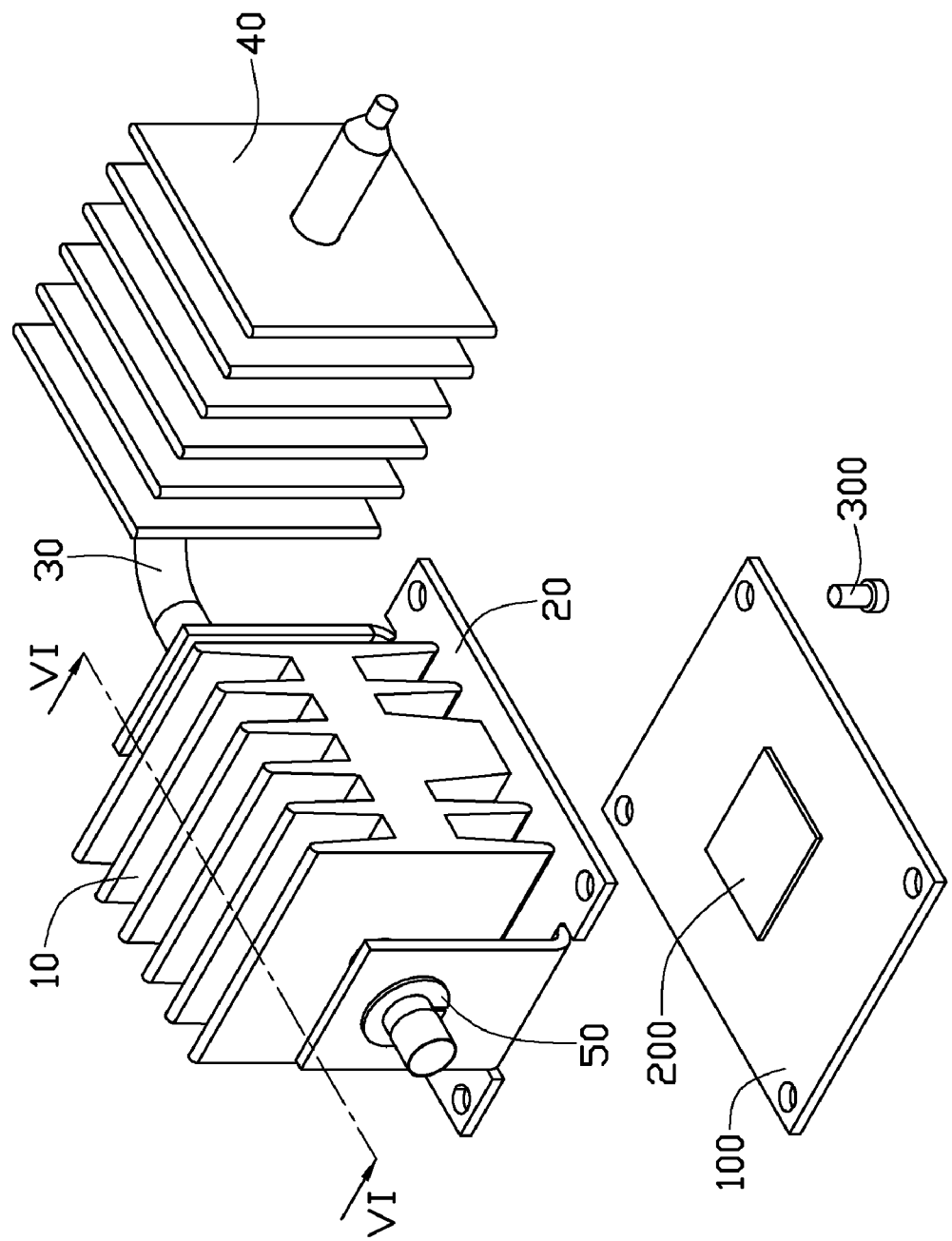
FIG. 1 is an assembled view of a heat dissipation device in accordance with an embodiment of the present disclosure, showing the heat dissipation device ready to be attached to an electronic component on a printed circuit board.
Figure 2:
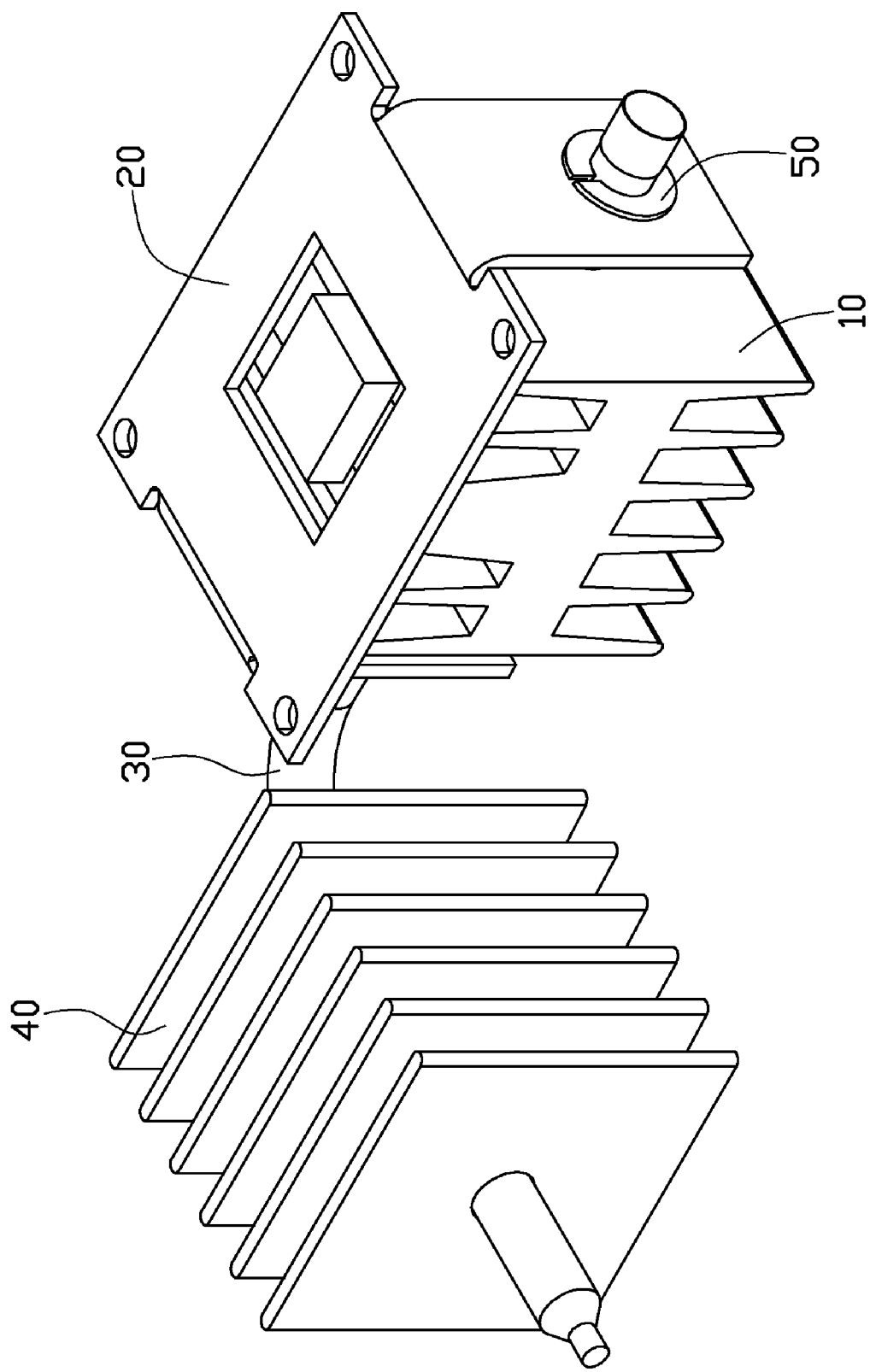
FIG. 2 is an inverted view of the heat dissipation device of FIG. 1.
Figure 3:
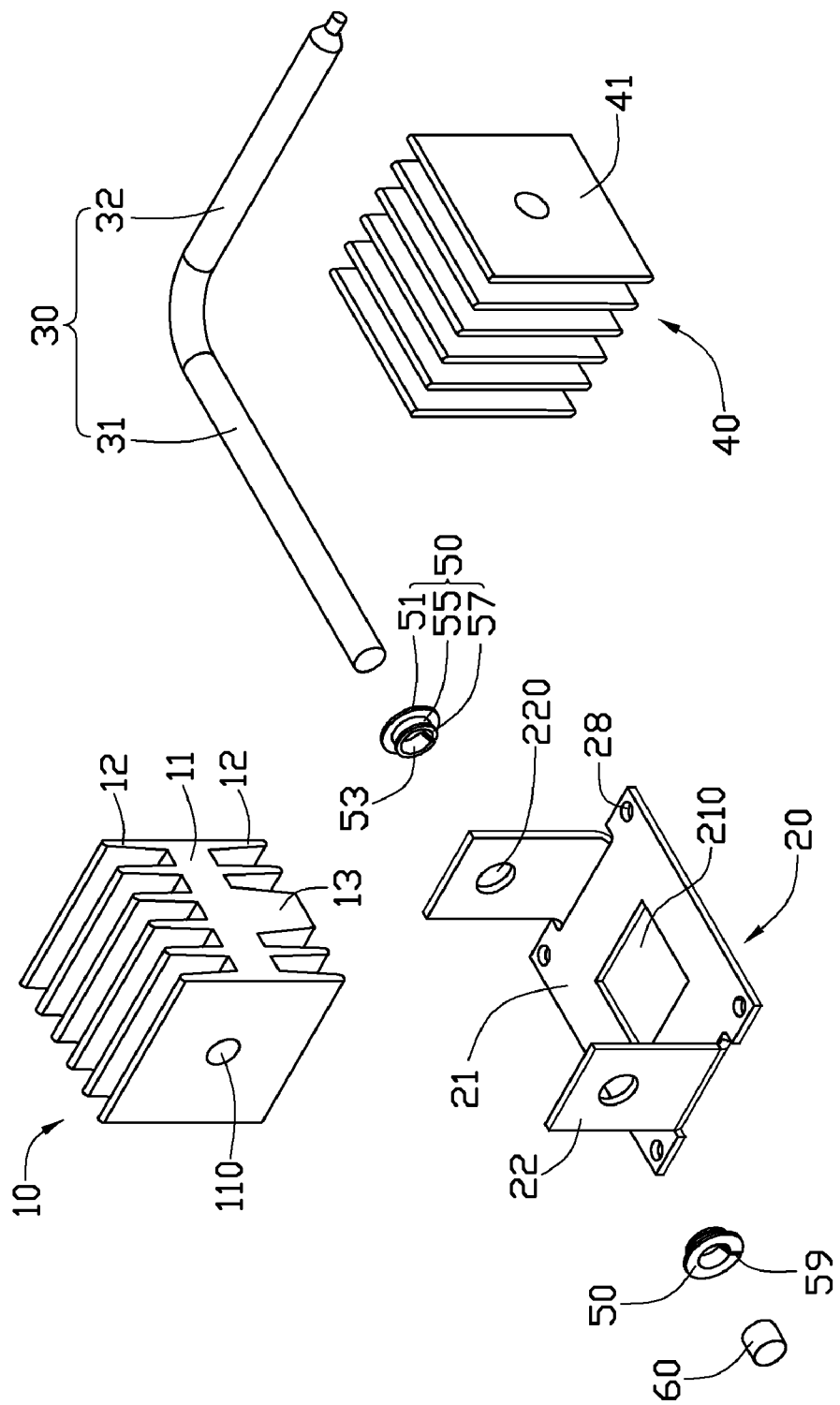
FIG. 3 is an exploded view of the heat dissipation device of FIG. 1.
Figure 4:
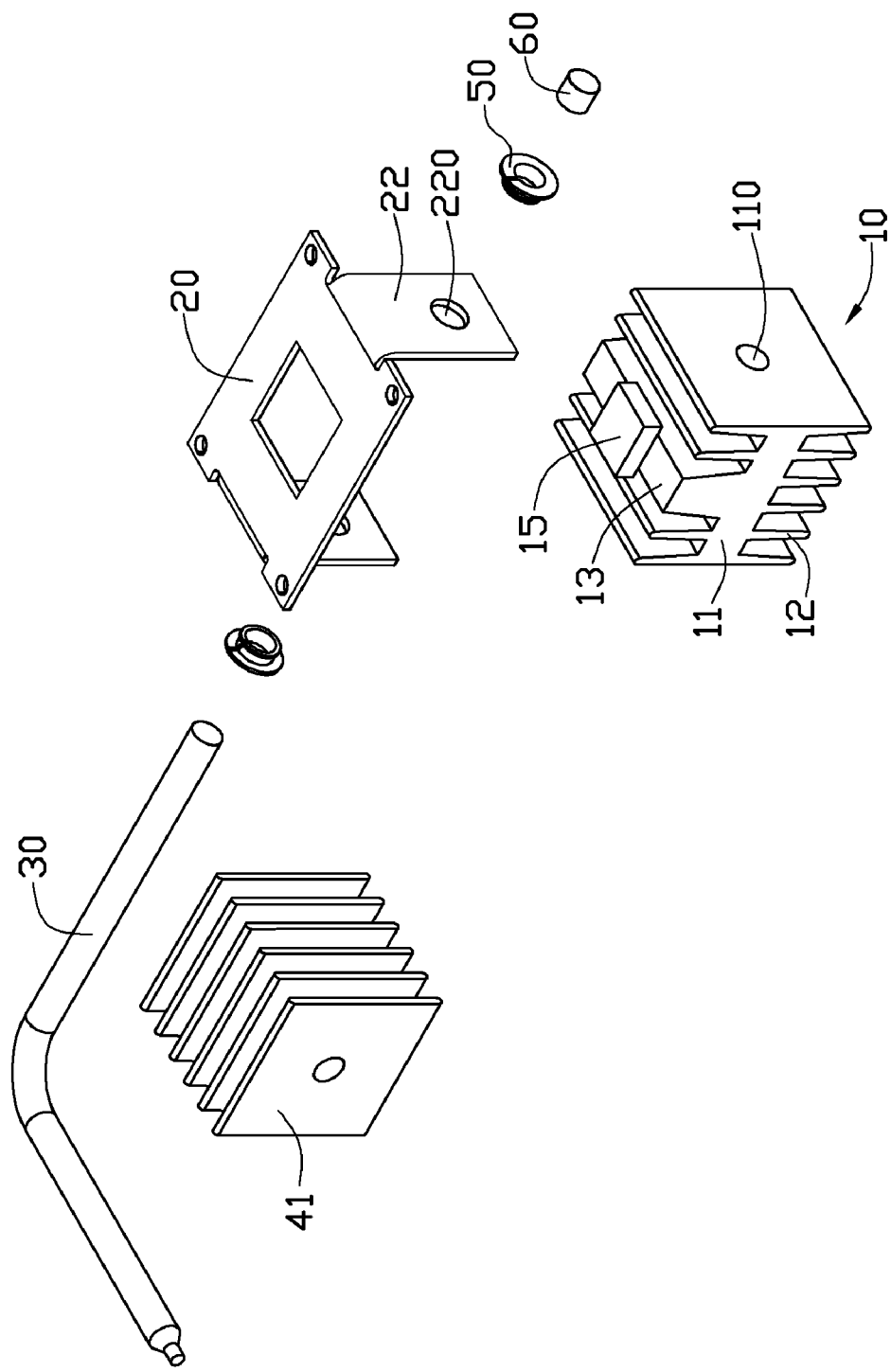
FIG. 4 is an exploded view of the heat dissipation device of FIG. 2.

Referring to FIGS. 1-4, an electronic device assembly in accordance with an embodiment of the disclosure is illustrated. The electronic device assembly comprises an electronic component 200 mounted on a printed circuit board (PCB) 100, and a heat dissipation device which is mountable on the electronic component 200 and printed circuit board (PCB) 100. When so mounted, the heat dissipation device thermally contacts the electronic component 200 to dissipate heat generated by the electronic component 200. The heat dissipation device comprises a heat sink 10 that is mounted on the electronic component 200, a bracket 20 mounted on the PCB 100, a heat pipe 30 engaged with the heat sink 10 and supported by the bracket 20, and a radiator 40 engaging around an end portion of the heat pipe 30.

Figure 5:
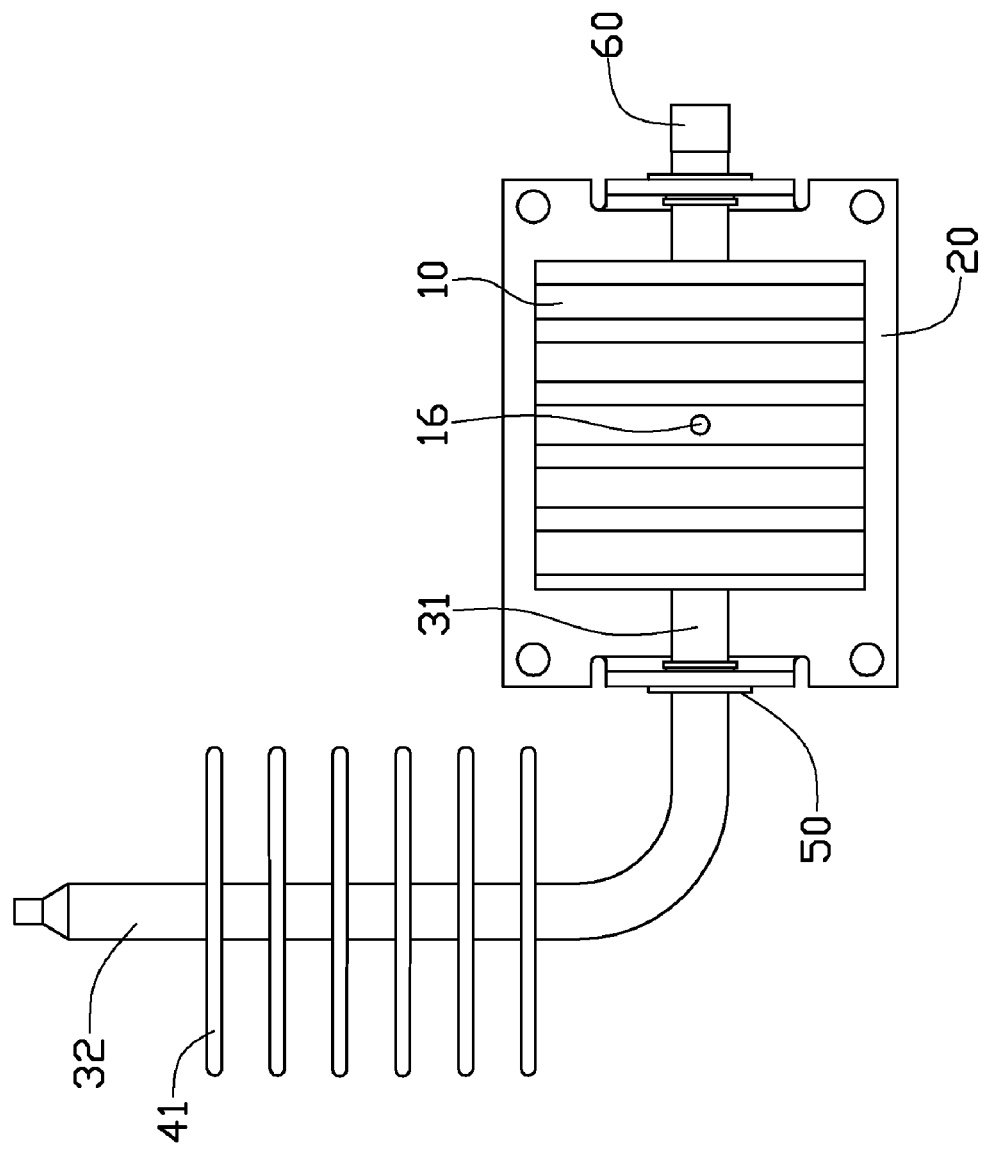
FIG. 5 is a top view of the heat dissipation device of FIG. 1.
Figure 6:
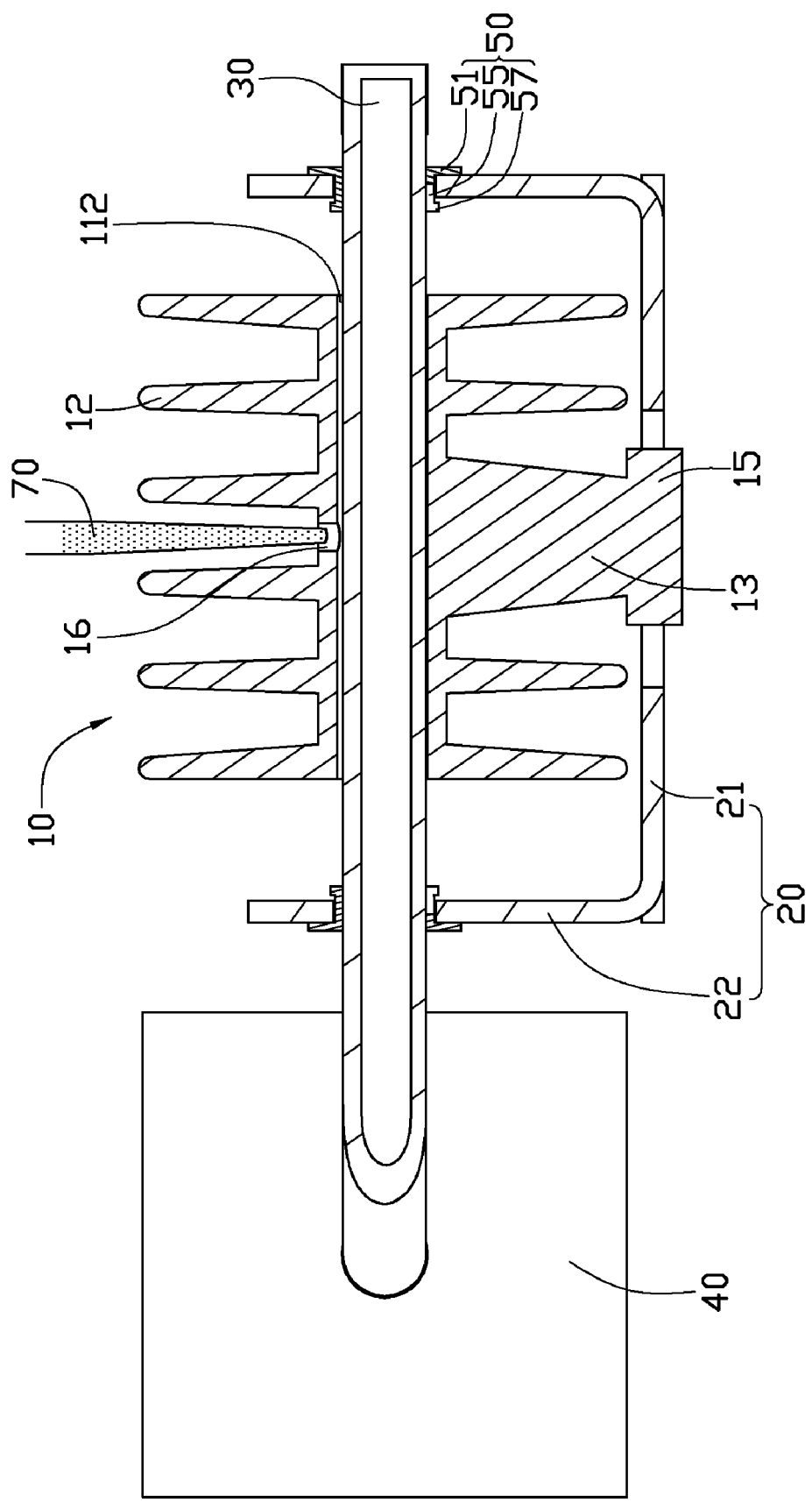
FIG. 6 is essentially a cutaway view of the heat dissipation device of FIG. 1, the cut taken along line VI-VI thereof.

The heat sink 10 is integrally formed of a metal with a good heat conductivity such as aluminum, copper, or an alloy thereof. In this embodiment, the heat sink 10 is made of extruded aluminum; that is, the heat sink 10 is formed of a single metal. The heat sink 10 comprises a main body 11, and a plurality of first fins 12 extending from a top and a bottom of the main body 11. The main body 11 has a heat spreader 13 extending from the bottom thereof. The heat spreader 13 is located between two groups of the first fins 12 at the bottom of the main body 11. A rectangular base 15 extends from a bottom of the heat spreader 13. The base 15 extends down and through the bracket 20 for contacting a top of the electronic component 200. The main body 11 defines a transverse channel 110 from one end to the other end thereof. The channel 110 has two outlets (not labeled) at the two ends of the main body 11. Referring also to FIGS. 5-6, the main body 11 defines an injection aperture 16 at a top thereof, to communicate the channel 110 with an exterior of the main body 11. Heat conductive grease 70 is injected into the channel 110 through the injection aperture 16. The injection aperture 16 is located between two middlemost of the first fins 12 at the top of the main body 11.

The bracket 20 comprises a bottom plate 21 and two supporting walls 22 extending upwards from two lateral sides of the bottom plate 21. The bottom plate 21 defines a rectangular opening 210 therein, for extension of the base 15 of the heat sink 10 therethrough. The bottom plate 21 defines four screw holes 28 at four corners thereof, for providing passage of fasteners 300 to mount the heat dissipation device onto the PCB 100. Each supporting wall 22 is vertical to the bottom plate 21, and defines a pivotal hole 220 corresponding to a respective one of the outlets of the channel 110.

The heat pipe 30 is L-shaped, and has a round transverse cross-section. The heat pipe 30 comprises an evaporating section 31 and a condensing section 32 perpendicularly connecting with the evaporating section 31. The radiator 40 comprises a plurality of second fins 41 thermally engaged with the condensing section 32.

The heat dissipation further comprises two sleeves 50 engaged in the pivotal holes 220 of the supporting walls 22, respectively. Each sleeve 50 defines a central hole 53 whose diameter is slightly larger than an outer diameter of the evaporating section 31 of the heat pipe 30. Each sleeve 50 has an axial split 59, thereby providing the sleeve 50 with elasticity. Each sleeve 50 comprises a middle neck 55 extending through the pivotal hole 220, a blocking portion 51 located at an outer side of the supporting wall 22, and a riveting portion 57 located at an inner side of the supporting wall 22. In this embodiment, each sleeve 50 can be elastically compressed by applying radial external force. When the sleeve 50 is compressed, a diameter of the riveting portion 57 of the sleeve 50 is smaller than a diameter of the pivotal hole 220 of the supporting wall 22, whereby the sleeve 50 can be extended through the supporting wall 22 and be received in the pivotal hole 220. When the sleeve 50 is released, the middle neck 55 rebounds and expands to tightly engage in the pivotal hole 220 of the supporting wall 22, with the blocking portion 51 and the riveting portion 57 sandwiching and abutting against the supporting wall 22. Thereby, the sleeves 50 are securely mounted on the supporting walls 22.

In assembly, the sleeves 50 are securely mounted on the supporting walls 22, and the heat sink 10 is placed between the supporting walls 22 with the channel 110 aligning with the sleeves 50. The evaporating section 31 of the heat pipe 30 is extended through the sleeves 50 in the supporting walls 22 and the heat sink 10. Then a free end of the evaporating section 31 is secured with a mounting ring 60, thereby keeping the heat pipe 30 engaged with the heat sink 10. A cylindrical (or annular) gap 112 is defined between an outer surface of the evaporating section 31 and an inner surface in the channel 110 of the heat sink 10, whereby the heat pipe 30 is pivotable relative to the heat sink 10 and the sleeves 50. The heat conductive grease 70 is injected through the injection aperture 16 and filled in the gap 112 between the evaporating section 31 and the heat sink 10. Because of the fluidity of the heat conductive grease 70, the heat conductive grease 70 can be evenly filled in the gap 112. The heat conductive grease 70 thermally contacts the evaporating section 31 and the main body 11 of the heat sink 10, thereby providing an efficient heat transfer path from the main body 110 of the heat sink 10 to the evaporating section 31 of the heat pipe 30. The fluidity of the heat conductive grease 70 enables the heat conductive grease 70 to be easily received in the gap 112. In addition, since the heat pipe 30 is pivotable in the heat sink 10, when the heat conductive grease 70 is filled into the channel 110, the heat pipe 30 can be simultaneously rotated relative to the heat sink 10 to facilitate flow of the heat conductive grease 70.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device for dissipating heat generated by an electronic component mounted on a printed circuit board, the heat dissipation device comprising:
    a heat sink comprising:
        a main body for contacting the electronic component,
        a transverse through channel, and
        an injection aperture, the injection aperture located at a top of the main body to communicate the channel with an exterior of the main body;
    a heat pipe comprising an evaporating section pivotably engaged in the channel of the main body and a condensing section extending from the evaporating section, wherein a generally cylindrical gap is defined between the evaporating section and the heat sink; and
    heat conductive grease filled in the gap between the evaporating section and the heat sink to thermally connect the heat sink with the heat pipe.

2. The heat dissipation device of claim 1, further comprising a bracket supporting and pivotably receiving the heat pipe therethrough.

3. The heat dissipation device of claim 2, wherein the bracket comprises a bottom plate and two supporting walls extending upwards from the bottom plate, the heat sink being located between the supporting walls.

4. The heat dissipation device of claim 3, further comprising two sleeves engaged in the supporting walls, respectively, the evaporating section pivotably engaged in the sleeves.

5. The heat dissipation device of claim 4, wherein each of the sleeves comprises a middle neck extending through a corresponding supporting wall, a blocking portion located at an outer side of the supporting wall, and a fastening portion located at an inner side of the supporting wall.

6. The heat dissipation device of claim 4, wherein each of the sleeves defines an axial split, thereby providing the sleeve with elasticity.

7. The heat dissipation device of claim 3, wherein the main body has a base extending down therefrom, the base extending through the bottom plate of the bracket for contacting the electronic component.

8. The heat dissipation device of claim 1, wherein the heat pipe is L-shaped, and has a round transverse cross-section.

9. The heat dissipation device of claim 1, wherein the heat sink further comprises a plurality of fins extending from the main body, the injection aperture being located between two of the fins.

10. An electronic device assembly comprising:
    a printed circuit board with an electronic component thereon; and
    a heat dissipation device mounted on the printed circuit board, the heat dissipation device comprising:
        a heat sink comprising a main body contacting the electronic component, the main body comprising:
        a transverse through channel; and
        an injection aperture, the injection aperture located at a top of the main body to communicate the channel and an exterior of the main body;
    a heat pipe pivotably engaged in the channel of the main body, wherein a generally cylindrical gap is defined between the heat pipe and the heat sink; and
    heat conductive grease filled in the gap between the heat pipe and the heat sink to thermally connect the heat sink with the heat pipe.

11. The electronic device assembly of claim 10, further comprising a bracket mounted on the printed circuit board, and pivotably receiving and supporting the heat pipe.

12. The electronic device assembly of claim 11, wherein the bracket comprises a bottom plate and two supporting walls extending upwards from the bottom plate, the heat sink being located between the supporting walls.

13. The electronic device assembly of claim 12, further comprising two sleeves engaged in the supporting walls, respectively, the heat pipe pivotably engaging in the sleeves.

14. The electronic device assembly of claim 13, wherein each of the sleeves comprises a middle neck extending through a corresponding supporting wall, a blocking portion located at an outer side of the supporting wall, and a fastening portion located at an inner side of the supporting wall.

15. The electronic device assembly of claim 13, wherein each of the sleeves defines an axial split, thereby providing the sleeve with elasticity.

16. The electronic device assembly of claim 12, wherein the main body has a base extending down therefrom, the base extending through the bottom plate of the bracket and thermally contacting the electronic component.

* * * * *